United States Patent [19]

Kurtz et al.

[11] 4,390,771
[45] Jun. 28, 1983

[54] BONDING WIRE BALL FORMING METHOD AND APPARATUS

[75] Inventors: John A. Kurtz, Gorham; Donald E. Cousens, Saco, both of Me.

[73] Assignee: Fairchild Camera & Instrument Corp., Mountain View, Calif.

[21] Appl. No.: 262,595

[22] Filed: May 11, 1981

[51] Int. Cl.³ .............................................. B23K 11/22
[52] U.S. Cl. ............................ 219/56.22; 219/56.21; 219/113; 219/130.51
[58] Field of Search ................. 219/56.1, 56.21, 56.22, 219/69 P, 130.51, 113

[56] References Cited

U.S. PATENT DOCUMENTS

| | | | |
|---|---|---|---|
| 3,254,194 | 5/1966 | Phillips | 219/113 |
| 4,310,741 | 1/1982 | Inoue | 219/69 P |
| 4,323,759 | 4/1982 | Edson et al. | 219/56.22 |

*Primary Examiner*—C. C. Shaw
*Attorney, Agent, or Firm*—Kenneth Olsen; Michael J. Pollock; Theodore Scott Park

[57] ABSTRACT

Method and apparatus for forming a ball at the end of bonding wire or lead wire in a capillary wire holding and bonding tool is described suitable for ball bonding of copper and aluminum lead wire to integrated circuit chips. A ball is formed by substantially enclosing the end of the bonding wire in a shroud or shield, flooding the shroud or shield and the end of the bonding wire with an inert gas, and generating a controlled pulse train of a preset count of electrical pulses for establishing arc discharge between the wire and the shroud or shield. The method permits precise control and metering of energy delivered by controlling the parameters of the pulses of the pulse train for melting and forming a ball of uniform quality without oxidation of the metal. Corresponding apparatus and circuitry are described which may be retrofitted into stock ball bonding machines or provide new machines.

37 Claims, 11 Drawing Figures

BONDING WIRE BALL FORMING METHOD AND APPARATUS

TECHNICAL FIELD

This invention relates to a new method and apparatus for forming a ball at the end of bonding wire or lead wire extending from a capillary wire holding and bonding tool. Such ball formation or "flame-off" has particular application for ball bonding of a lead wire to the die pad of an integrated circuit chip. The invention provides controlled delivery of energy for forming balls of uniform quality on lead wires of copper, aluminum and other reactive metals in addition to gold and silver.

BACKGROUND ART

Figure 1:
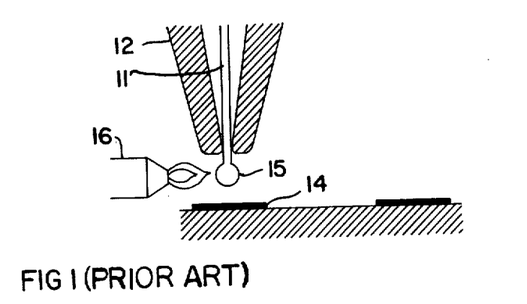
FIGS. 1-3 are diagrammatic side cross sections of a ball bonding sequence or cycle as known in the prior art.

Bonding of lead wires between a microcircuit chip and the lead frame in which the chip is mounted for coupling to external circuitry is generally accomplished by "ball/wedge" bonding. According to this technique a lead wire or bonding wire 11 is held in a capillary tool 12 so that the lead wire 11 projects beyond the end of the tool as shown in FIG. 1. The capillary tool 12 forms part of a ball bonding machine in which the tool is appropriately mounted and positioned over the metallized die pad 14 of an integrated circuit chip or other substrate. As shown in FIG. 1 a ball 15 of metal is formed at the end of the lead wire or bonding wire 11 by melting for example with a gas flame torch 16 such as an hydrogen flame torch. This procedure is sometimes referred to as "flame-off".

Figure 2:
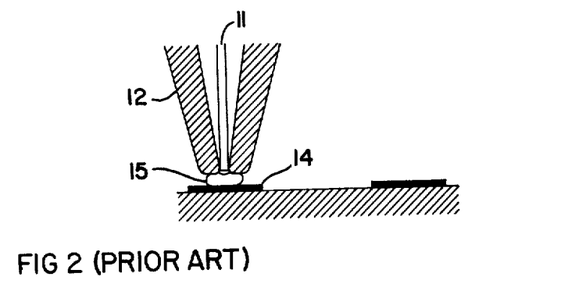

After solidification, the metal ball 15 at the end of the wire is brought into intimate contact with the metallized die pad 14 as shown in FIG. 2. A bond is formed typically by thermocompression bonding applying a specified force and temperature for a specified period of time. Metallic welding and diffusion combine to form this basic bond. Alternatively, ultrasonic bonding or other form of energy may be used. The capillary tool 12 and substrate 17 are then moved relative to each other for bonding of the wire at another location such as for example a lead frame finger 18. At this location a wedge bond between the lead wire 11 and finger 18 is generally formed and the lead wire or bonding wire 11 is severed below the bonding tool. In this manner a lead wire connection is established between the metallized substrate of a chip and the lead frame for coupling to external circuitry.

Further background on ball bonding of lead wires can be found in the article "Evaluating Wire Bond Quality" by Steven W. Hinch and Donald R. Cropper in the February 1981 issue of *Semiconductor International*.

Ball bonding is the preferred method for welding lead wires to the die pad of integrated circuit chips because the ball can tolerate a greater range of bonding parameters without weakening the wire and furthermore, the lead wire can be led in any direction from the symmetrical weld. A number of problems are encountered in ball formation however which have generally limited its application to the use of relatively expensive gold lead wires and bonding wires. The primary difficulty in applying the ball bonding method to, for example copper wire and aluminum wire occurs during ball formation. The tip of the wire is melted either by a hydrogen gas torch as shown in FIG. 1 or by arc discharge between the tip of the wire and a suitably placed electrode. For arc formation capacitor discharge has been used typically about 500 volts from a two microfarad capacitance. However, during ball melting and formation the copper or aluminum or other reactive metal wire oxidizes and the resulting oxide film prevents or interferes in the subsequent ball weld to the surface pad. Oxidation also prevents uniform quality ball formation. As a result the ball bonding technique has generally been limited to the use of gold wires.

Ball bonding has been applied to aluminum wires by the Welding Institute, Abbington Hall, Abbington, Cambridge, England CBI 6AL as appears in the article "Ultrasonic Ball/Wedge Bonding of Aluminum Wires" by C. J. Dawes, K. I. Johnson, and M. H. Scott in the proceedings of the European Hybrid Micro Electronics Conference 1979, Ghent. This article appears under the same title by C. J. Dawes and M. Weldl in the January 1979 issue of the Welding Institute Research Bulletin, on pages 9 through 14. According to the Welding Institute method a hydrogen flame is not used for ball formation or flame-off because of oxidation. Rather electric discharge is used by means of a capacitor discharge technique and with an argon gas shield. A capacitor discharge ball forming attachment for aluminum wire was incorporated by the Welding Institute on the Kulicke and Soffa Industries, Inc. 472 ball bonding machine. A capacitor of selected size is discharged between the aluminum wire and an electrode in the presence of inert gas.

A disadvantage of the Welding Institute method is that the capacitor discharge generated arc results in considerable variation in the energy delivery to the end of the bonding wire for melting and ball formation. The capacitor discharge also results in considerable variation in the ionization and arc formation between the wire and complementary electrode.

Figure 3:
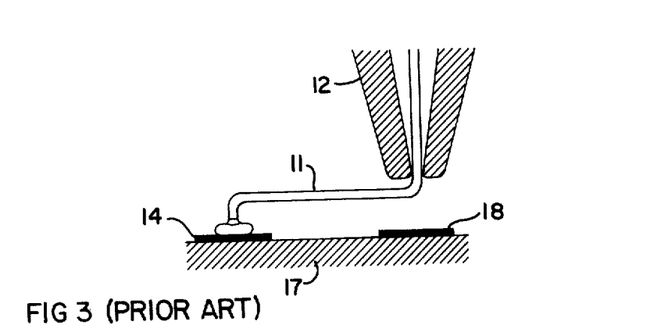
Figure 3A:
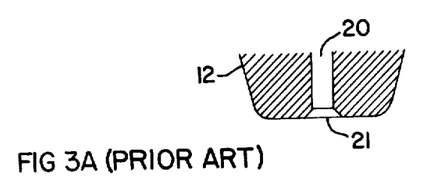
FIG. 3A is a detailed side cross section of the tip of a capillary wire holding and bonding tool as known in the prior art.

Referring to FIG. 3A a detail is provided of the tip of a prior art capillary tool. The tip of the capillary tool 12 shows the central capillary channel 20 in which the bonding wire is held so that it extends below the tip of the tool through the conical flare 21. The lead wire or bonding wire may be typically in the order of 25 micrometers in diameter. In the previous electronic flame off methods such as that of the Welding Institute, capacitor discharge to form the ball offers little control over the energy delivered. As a result the wire may melt into the capillary 20 and the capillary must be pushed out or cleaned. The single irregular pulse discharge from a capacitor further results in variability of the pulse of energy. Yet another disadvantage of the irregular discharge is that excess energy may be delivered beyond what is precisely required for melting the desired volume of metal at the end of the wire. This excess energy causes undesirable oxidation and oxide formation on the ball metal. Prior art attempts at electronic flame off have generally resulted in ball formation of non uniform quality.

An example of a ball bonding machine which uses capacitive discharge of a single irregular pulse for ball formation is the Dage Precima AB-10 "Aluminum Spark Ball System". This system is identified by Model no. 83-9461 available from Dage Precima International in Colchester, United Kingdom. This machine uses a series of capacitors which may be switched in and out of parallel to control or vary the quantity of charge at the same voltage. However, the capacitors are fully discharged in a single irregular pulse. These capacitors are controlled by an SCR which stays on until the capacitive discharge current falls to an extremely small holding level.

OBJECTS OF THE INVENTION

It is therefore an object of the present invention to provide a new method and apparatus for uniform quality ball formation at the end of bonding wire used for ball bonding to a chip or other surface. Another object of the invention is to provide a ball forming method and apparatus suitable for lead wires of copper, aluminum and other reactive metals thereby eliminating the expense of gold bonding wire leads.

A further object of the invention is to provide a method and circuitry for precisely controlling and metering the energy delivered to the end of a bonding wire for ball formation. Excess energy beyond that required for melting a ball of desired volume is therefore avoided along with the attendant problems of capillary blocking, oxidation, and non uniform formation of the ball.

The invention is also constructed and arranged to facilitate retrofitting into existing ball bonding machines presently used in the industry. Thus the invention is readily adaptable with minimum expense in the stock machines such as those supplied by Kulicke and Soffa Industries, Inc.

DISCLOSURE OF THE INVENTION

In order to accomplish these results the present invention provides a method for forming a ball at the end of bonding wire extending from a capillary tool by substantially enclosing the end of the bonding wire in a shroud or shield, flooding the shroud or shield and the end of the bonding wire with an inert gas, and generating a controlled pulse train of a preset count of electrical pulses for establishing arc discharge between the wire and the shroud or shield which function as complementary electrodes. The method thus permits precise control and metering of energy delivered for melting and forming a ball of uniform quality at the end of the wire and avoids oxidation of the metal.

According to the method the controlled pulse train comprises pulses of substantially uniform pulse width and duty cycle, pulse height or amplitude, and pulse frequency. The quantity of energy delivered by the pulse train may be varied to precisely match the energy requirements for melting a ball of desired volume by varying the parameters of the pulses. Thus, the number of pulses or duration of the pulse train, the pulse width or duty cycle, and the pulse height or amplitude may be varied to precisely meter the delivered energy. In the preferred form a constant pulse width or duty cycle and pulse height or amplitude are maintained while the number of pulses are counted and metered for metering the delivered energy.

More particularly the method for generating and delivering pulses for arc discharge between the wire and shroud involves generating a first pulse train of low voltage electrical pulses, counting the pulses of the first pulse train, and cutting off the first pulse train after a specified preset number of pulses have been counted. A second pulse train of high voltage pulses is initiated simultaneously by the low voltage pulses. Generally to accomplish this, a high voltage switch switches or gates a high voltage source at the output in response to the low voltage pulses. In the preferred form the invention contemplates switching high voltage capacitance into and out of the bonding wire and shroud circuit, discharging substantially no more than a minor percentage of the charge stored in the capacitors, and recharging the capacitors between pulses. By this expedient a substantially constant voltage and uniform character of the pulses is maintained.

To perform this method the invention provides apparatus suitable for retrofitting an existing stock ball bonding machine or for providing an entirely new machine. The ball bonding apparatus includes a shroud movably mounted for positioning substantially around the end of the bonding wire and a tubular portion for delivering inert gas around the end of the bonding wire. An actuator such as a pneumatic piston moves the shroud between a retracted position and an extended position substantially around the end of the bonding wire. Pulse generating control and logic circuitry controls and limits the energy delivered for arc discharge and for melting and ball formation at the end of the wire.

This circuitry includes a pulse oscillator for generating a first pulse train of low voltage pulses, counters for counting the pulses of the first pulse train, and a logic gate for cutting off the pulse oscillator and first pulse train after a specified preset number of pulses have been counted. A high voltage source is provided in the form of a step up transformer and rectifier for charging a high voltage capacitor or plurality of capacitors in series. A high voltage switch such as a power transistor controlled by the first pulse train of low voltage pulses switches the high voltage capacitors into and out of the output circuit through a current limiting resistor for generating the high voltage second pulse train corresponding to the first pulse train. The high voltage capacitance and current limiter are selected so that a few percent and no more than ten percent of the charge stored in the capacitor is discharged during the high voltage pulse generation.

For control and sequencing of the ball bonding operation the apparatus includes a timing wheel with at least one timing slot and a first sensor responsive to the first slot for actuating a solenoid which in turn delivers air to the pneumatic piston for extending the shroud over the end of the bonding wire. A second sensor determines that the shroud is in extended position and in turn actuates delivery of inert gas such as argon for flooding the end of the bonding wire with inert gas and purging air from the vicinity. The circuit for generating and delivering a controlled pulse train of a preset count of electrical pulses for arc discharge is also responsive to the second sensor. However a circuit delay insures that air has been purged from the shroud by flooding with inert gas prior to generating the pulse train.

The shroud or shield for enclosing the end of the bonding wire and capillary tool is in the form of a tubular enclosure formed with a notch extending a sufficient distance into the tube for receiving the end of the capillary tool and bonding wire. A tungsten electrode spot may be bonded to the tubular shroud.

A feature and advantage of the electronic flame off system for ball formation according to the present invention is that precise control can be maintained over energy delivered to form the ball. According to the invention the delivered energy is divided into a train of uniform pulses at a frequency of, for example, 1.5 KHz extended over a period of time rather than as one irregular discharge from a capacitor as is known in the prior art. Such a train of pulses initiates and maintains uniform ionization of the gas between the end of the bonding wire and the electrode shroud for uniform arc discharge. The frequency of the pulses is therefore selected to maintain such ionization for example of argon gas, and 1.5 KHz frequency has been found suitable for this purpose.

Because the total energy is delivered in a precise stream over a period of time a uniform and steady melt can be achieved at the end of the ball and terminated at a precisely specified ball volume. The train of pulses may be controlled to prevent the molten ball from climbing into the capillary as may occur with a single blast from a capacitor discharge.

The train of small pulses permits control over where the ball stops and the entire tail length of bonding wire extending below the capillary tool is not necessarily melted. With capacitor discharge of a single irregular pulse the entire tail end of the wire may melt and possibly more extending into the capillary in some cases.

Another advantage of the precise metering of delivered energy is that excess energy which merely oxidizes the surface of the metal such as copper or aluminum is avoided. The metered pulse train permits forming consistent balls without excess energy.

Thus, the present invention does not rely upon discharge of capacitors as in prior art electronic flame-off devices. The present invention utilizes capacitors in a fundamentally different manner for the voltage build up across the high voltage capacitors and without significant discharge of current from the capacitors. The high voltage capacitors in combination with a power transistor deliver for example 600 volts and the high voltage is applied periodically to the output by the transistor switch which responds to the low voltage pulses from the pulse oscillator. Only a small current discharges from the capacitors to form the individual pulses and the capacitors are in turn recharged between cycles. Therefore the capacitors never discharge more than a few percent of the stored charge maintaining a substantially constant voltage of the high voltage pulses for sustained arc discharge between the end of the bonding wire and shroud.

Other objects, features and advantages of the invention will become apparent in the following specification and accompanying drawings.

BEST MODE FOR CARRYING OUT THE INVENTION

Figure 4A:
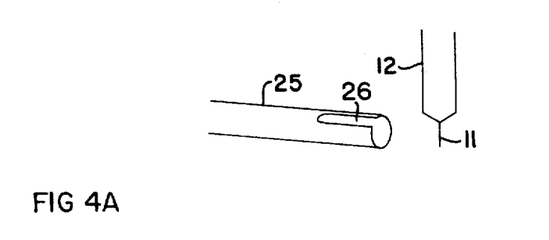
FIGS. 4A and 4B are fragmentary perspective views of the tubular flame-off shroud or shield according to the present invention for enclosing the end of the capillary tool and bonding wire.
Figure 4B:
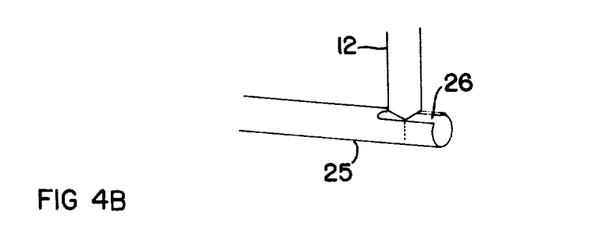
Figure 5:
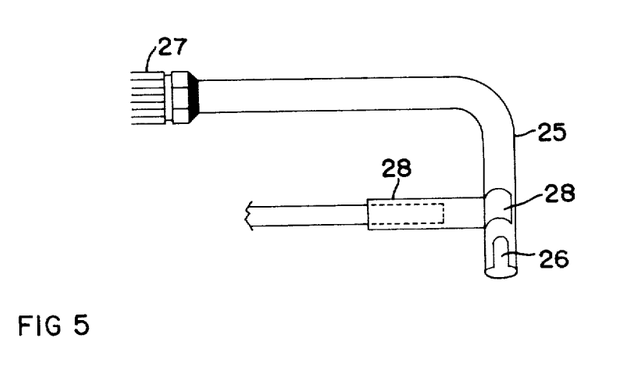
FIG. 5 is a detailed plan view of the flame-off shield.

A tubular shroud or shield 25 suitable for enclosing the end of the capillary tool and bonding wire according to the present invention is shown in FIGS. 4A and 4B. The shroud 25 is formed for example, from a tube 3 mm to 4 mm in diameter of stainless steel or other conducting material. The end of the tubular shroud is formed with a notch 26 1½ mm to 2 mm wide and 6 mm-7 mm long. In any event the notch is appropriately dimensioned for receiving and substantially enclosing the tip of capillary tool 12 and the end of the bonding wire 11 as shown in FIG. 4B.

The tubular shroud 25 provides a conduit for delivering an inert gas such as argon and is connected to an appropriate fitting 27 for coupling to a source of argon or other inert gas through a gauge used to meter the argon flow. Near the end of the shroud 25 and adjacent the notch 26 an electrode 28 is electrically connected to the shroud so that the shroud forms a complementary electrode with the end of the bonding wire 11. The electrode can be constructed so that at the joint with the shroud a tungsten spot or area on the inside of the shroud provides a preferred site for arc discharge between the end of the bonding wire 11 and the electrode 28.

Figure 6:
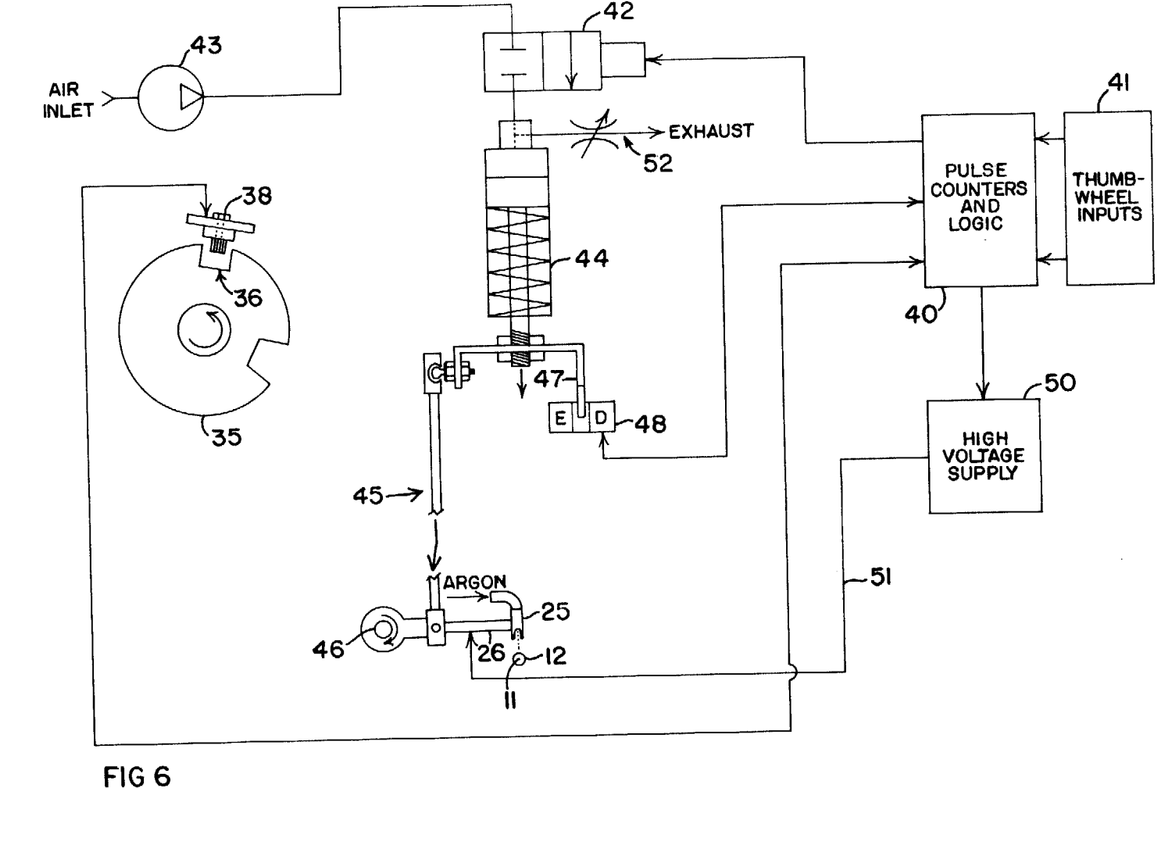
FIG. 6 is a diagrammatic view of the apparatus for forming a ball at the end of bonding wire or lead wire extending from a capillary tool according to the preferred embodiment of the present invention.

Apparatus for achieving the flame-off cycle according to the present invention is illustrated in FIG. 6. This apparatus may be retrofitted to a stock ball bonding machine such as the Kulicke & Soffa Industries Inc. (K & S) Model 478 or it may be the basis for a new machine. A timing wheel 35 such as found on the K & S Model 478 is provided with a notch 36. After completion of the previous flame-off cycle and ball bonding cycle, the notch 36 aligns with a first sensor 38 which detects the notch and delivers a trigger signal to the logic circuitry 40 hereafter described which in turn energizes solenoid 42. Solenoid 42 admits air from compressor 43 into the air piston or pneumatic piston 44 causing it to extend. Lever arm sequence 45 swings the flame off shield 25 and electrode 26 into position substantially enclosing the tip of capillary tool 12 and the end of the bonding wire in the manner of FIG. 4B. As shown in FIG. 6 the lever arms 45 swing the shield 25 into position around a pivot point 46.

The pneumatic or air piston control gives better timing and synchronization as well as mechanical clearance for the shroud than the mechanical cam control of prior art stock machines. When the pneumatic piston 44 is fully extended and the flame-off position established, a second infra-red sensor 48 including an infra-red emitter E and detector D senses the crossing of flag 47 to initiate the flame-off sequence according to the present invention.

Sensor 48 signals the logic circuitry 40 which causes a number count preset on thumb wheels 41 to be loaded into the counters of the logic circuitry 40. At the same time the logic circuitry 40 initiates a short delay in pulse generation while argon gas from a source not shown purges the shield 25 and end of the capillary tool and bonding wire of air.

After the short dwell or delay has passed, the preset number of high voltage pulses is generated from high voltage supply 50 and conducted down lead 51 for arc discharge between the end of the bonding wire 11 and electrode 26. The controlled arc melts a ball of uniform quality on the end of the bonding wire in a pure argon atmosphere avoiding oxidation of the metal. Lead wires of copper and aluminum for example may therefore be used eliminating the expense of gold wires. A negative ground circuit is used in the example shown in FIG. 6 with the bonding wire 11 forming the grounded electrode.

The counters of logic circuit 40 decrease their count by one each time a high voltage pulse is supplied, all as hereafter described with reference to FIG. 7. When the preset count reaches zero or is completed no further pulses are generated. A signal de-energizes solenoid 42 and the remaining air pressure from air piston 44 bleeds out through exhaust bleeder 52. The piston 44 rapidly retracts swinging the argon shield 25 away from the capillary bonding tool. The bonding machine then returns to standard operation and the operator bonds the ball of the bonding wire to a die pad or other surface by thermocompression, ultrasonic bonding, etc. as illustrated in FIGS. 1 through 3. Upon completion of this bonding cycle the timing wheel 35 can initiate a new flame-off cycle.

Figure 7:
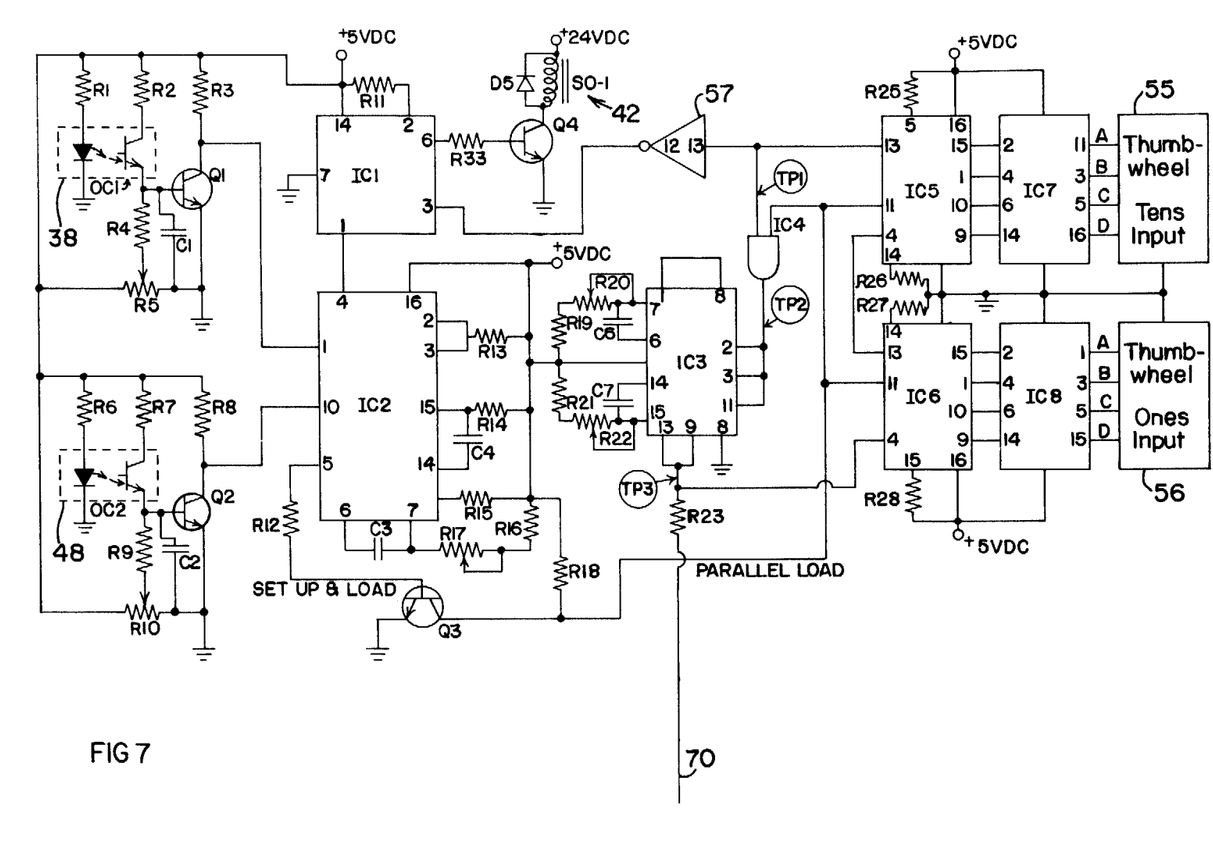
FIG. 7 is a detailed schematic diagram of the circuitry for delivering a controlled pulse train of counted pulses for uniform quality ball formation at the end of the bonding wire, continuing along line 70 to FIG. 7A.
Figure 7A:
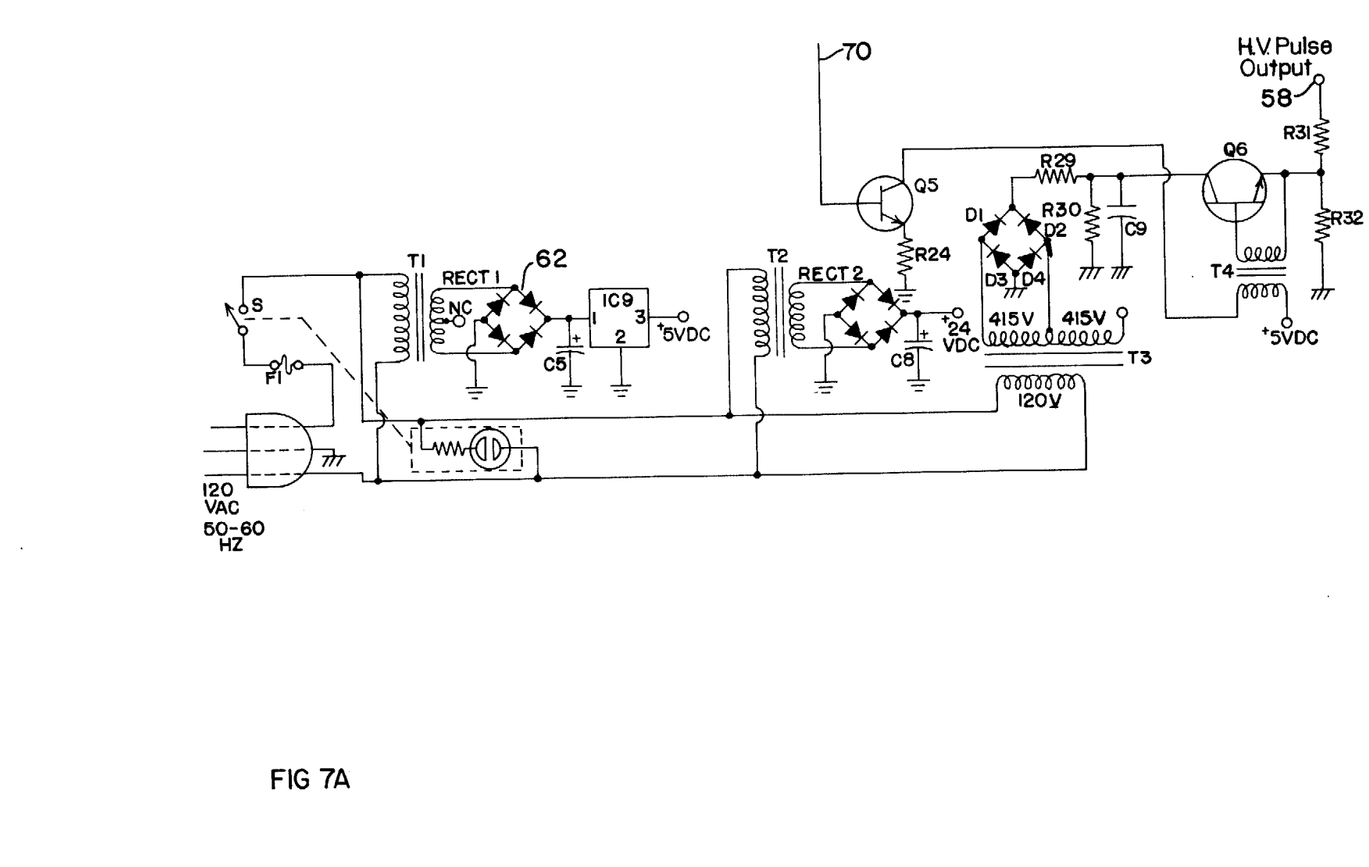
FIG. 7A is a continuation of the circuit diagram of FIG. 7 on a separate sheet along connecting line 70.

Referring to FIG. 7 and continuation at FIG. 7A a detailed circuit diagram is provided for effecting the flame-off cycle and controlled generation and delivery of pulses in accordance with the present invention. The circuit includes a number of integrated circuit chips designated IC. In each case a generic type number designation is given in the text, and the pin numbers for the circuit connections are noted in smaller numerals on each chip.

Circuit chip IC 2, for example a 74 LS 123 dual one-shot multivibrator is used as two separate components. One section of IC 2 receives the trigger signal from the first sensor 38 through amplifier transistor Q1. This multivibrator section of IC 2 provides a set pulse to flip flop IC 1. IC 1 may be for example one half of a 74 LS 74 chip package. IC 1 through transistor Q4 energizes solenoid 42 for extending the air piston 44 as previously described.

The section two multivibrator of IC 2 receives the trigger pulse from the second infra-red sensor 48 through amplifier transistor Q2 and introduces the dwell or time delay during which argon gas delivered through the tubular shield 25 purges the shield, capillary tool and bonding wire of air. The second multivibrator section of IC 2 also turns on transistor Q3 which parallel loads the counters IC 5 and IC 6 with the preset number count selected at thumb wheels 55 and 56 as hereafter explained.

The infra-red sensors 38 and 48 also designated OC 1 and OC 2 respectively may be for example GE H13B1 devices including an infra-red emitter/detector pair packaged so that when an opaque object moves between the emitter and detector, the detector stops conducting. OC 1 therefore detects the notch or slot 36 in the timing wheel 35 while OC 2 detects the flag 47 coupled to the air piston 44 when the piston is in extended position.

Figure 8:
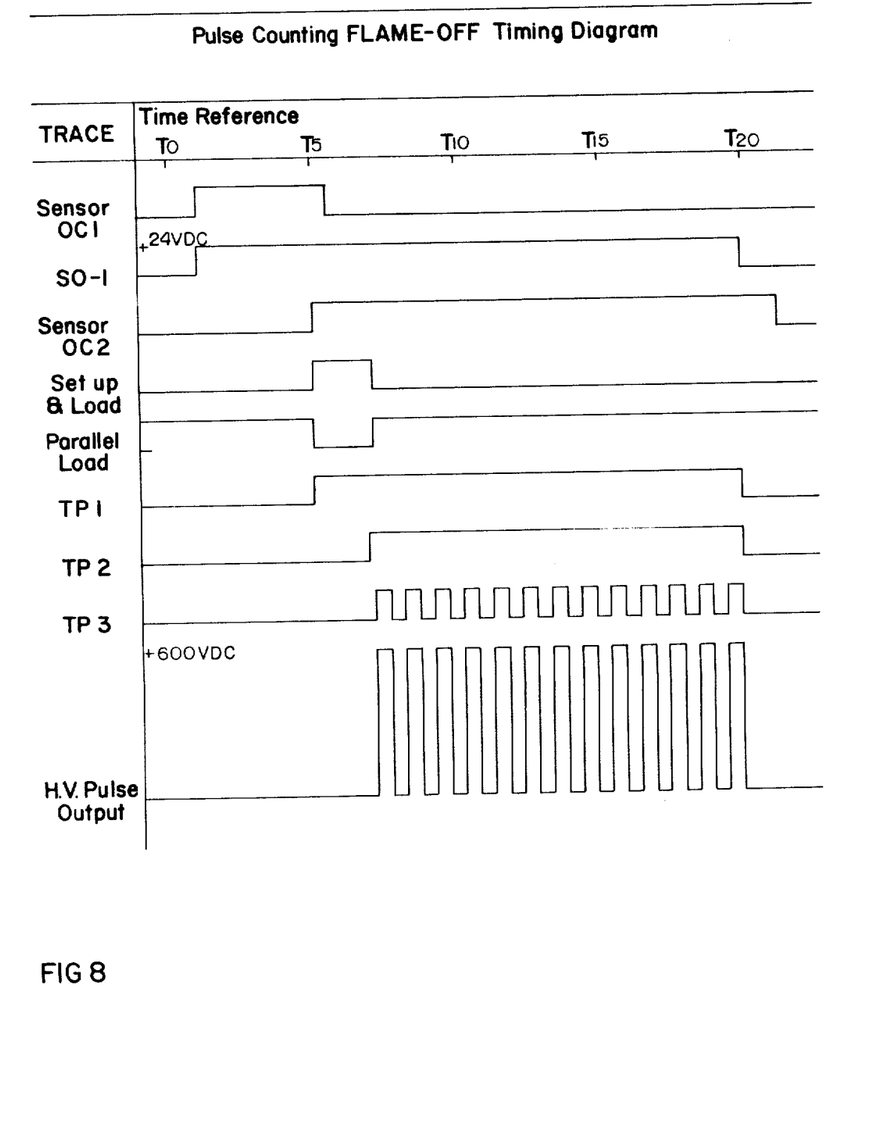
FIG. 8 is a timing diagram of signals in the detailed circuit of FIGS. 7 and 7A.

Further understanding of the operation of the circuit of FIG. 7 is provided by reference to the signal traces of timing diagram of FIG. 8. The timing diagram shows the signal from first sensor 38 (OC 1) followed by the energizing signal at solenoid SO-1 also designated 42. The trigger signal from the second sensor 48 (OC 2) is followed by the set up and load delay pulse signal and the parallel load signal to the counters. The further signal traces related to the pulse generation are hereafter described.

Circuit chip IC 3 is another dual one shot multivibrator for example a 74 LS 123, connected as a pulse oscillator. Each section of IC 3 is connected to trigger the other section providing the pulse output shown as trace TP 3 of FIG. 8. This pulse oscillator output drives the output transistor Q6 by energizing transistor Q5 which in turn pulses the output transformer T4. As a result, high voltage pulses in the order of 600 volts shown as trace HV pulse out of FIG. 8 appears at the output 58 all as hereafter fully described. The pulse output of pulse oscillator IC 3 also drives the counters IC 5 and IC 6.

Circuit chips IC 5 and IC 6 are up/down counters used as down counters in the circuit and may be for example 74 LS 192 chips. The tens digit preset number data from thumb wheel 55 is entered into the down counter IC 5 during the argon purging delay. The thumb wheel tens input passes through hex inverter chip IC 7, which may be for example a 74 LS 04. Four of the inverters on IC 7 are used to invert the outputs from the thumb wheel switch 55 for parallel input to counter IC 5. One of the remaining inverters 57 is used to invert the borrow output from IC 5 to provide a reset signal to the flip flop IC 1.

Down counter IC 6 is loaded with the ones digit preset number data obtained from the ones input thumb wheel 56 also during the argon purging delay or dwell. Hex inverter IC 8, also a 74 LS 04 chip is used to invert the four thumb wheel outputs from the thumb wheel 56 for parallel loading into down counter IC 6. Down counter IC 6 receives pulses from the pulse oscillator IC 3 and each pulse causes the count in IC 6 to be decremented by one. When the count on IC 6 reaches zero, a borrow pulse is internally generated which decrements down counter IC 5 by one. When both counters have been decremented to zero circuit chip IC 4 is instructed to shut off the pulse oscillator IC 3 so that no more pulses are produced. When the count reaches zero, IC 1 is also reset so that the air piston will retract and pull the flame-off shield 25 out of the way to the retracted position.

The signal output from counter IC 5 is shown as signal trace TP 1 on the timing diagram of FIG. 8. This provides an input to circuit chip IC 4, an AND gate such as a 74 LS 08. The output of circuit chip IC 4 is shown as signal trace TP 2 in the timing diagram of FIG. 8 and allows the oscillator to run only until the proper number of preset pulses have registered in counters IC 5 and IC 6. Thus, signal TP 2 initiates the pulse output from pulse oscillator IC 3 after the argon purge delay and then cuts off the pulse output of pulse oscillator IC 3 when the number count preset at thumb wheels 55 and 56 loaded in the counters IC 5 and IC 6 has been counted.

Pulse oscillator IC 3 initiates a train of pulses of low voltage of for example five volts shown in the signal trace TP 3 of FIG. 8. All of the five volt DC power supply for the circuit chips and low voltage portions of the circuit of FIG. 7 and 7A is derived from the voltage regulator circuit IC 9 which may be for example a 7805-T chip. The input to voltage regulator IC 9 is derived from RECT 1 full wave bridge rectifier 62 which converts the AC output of step down transformer T1 into DC. The transformer T1 may be for example a Thordarson 21F205 120 volt primary 10 volt AC secondary used as a step down transformer for supplying the plus 5 volts regulated DC power supply through rectifier 62 and voltage regulator IC 9.

On the other hand transformer T3 may be for example a Thordarson 21P73 120 volt AC primary 415 volt AC secondary step up transformer which is used to develop the high voltage pulse train. This is accomplished by providing a rectified 415 volt output at the secondary of T3 through RECT 2 a full wave bridge rectifier. The diodes D1-D4 may be for example SK3081/125 diodes and provide the full wave bridge for rectifying the high voltage AC output of transformer T3. This high voltage rectified output is coupled through a current limiting resistor R29 having a resistance of for example 6.8K ohms rated at one half watt and 10% tolerance limits. The rectified output from step up transformer T3 charges the capacitance C9 which comprises for example, four 40 microfarad 450 volts DC capacitors in series for providing the high voltage at the output through power transistor Q6. The high voltage capacitance C9 amounts to 10 microfarads which could also be provided for example by two 20 microfarad capacitors in series. The resistance R30 comprises for example four 1 megohm resistors connected in series rated at one half watt and 10% tolerance each. Resistors R30 function as capacitor bleeder resistors.

The low voltage pulse train represented by signal trace TP 3 at the output of pulse oscillator IC 3 drives transistor Q5. The collector current of Q5 which may be for example a 2N 3904 transistor, flows through the primary of transformer T4 which induces a secondary voltage capable of saturating the high voltage output transistor Q6 so that it becomes conducting. Thus high voltage transistor Q6 which may be for example an SK3844/123 switches or closes the circuit across the capacitance C9 permitting a small current at high voltage to pass each cycle from the capacitance C9 through the current limiting resistor R31 in the range of 120K to 160K ohms. In the normal mode of operation transistor Q6 oscillates in response to the pulses from IC 3 and Q5 turning on and off the current across the capacitance C9 at a 50% duty cycle. The capacitors C9 are therefore not discharging beyond a few percent of the stored charged and in any event no more than 10 percent. During the off half of each cycle the capacitors of capacitance C9 are charged by the power transformer T3 so that the voltage delivered through transistor Q6 remains effectively constant at approximately 600 volts varying no more than a few percent and at most no more than 10 percent. This variation is generally not measurable on the oscilloscope. At a pulse frequency of 1.5 KHz having a cycle period of 1/1500 seconds the capacitors of capacitance C9 discharge for 1/3000 second and recharge regularly.

A pulse train of low voltage pulses in the order of five volts at 1.5 KHz therefore controls the generation of the high voltage output pulse train in the order of 600 volts. Transformer T4 which may be for example a Radio Shack 273-1380 is used as an isolation transformer for isolating the 415-600 volts high voltage supply portion of the circuit from the low voltage 5 volt DC regulated power supply for the IC chips and low voltage portions of the circuit.

Transformer T2, for example a Radio Shack 273-1512 120 volt AC primary 25.2 volt AC secondary is a step down transformer for providing the 24 volt DC power supply for the solenoid 42 also referred to as SO-1. Solenoid SO-1 may be for example a Clippard EV-2-24 air solenoid.

The power supply of the circuit is also provided with a power switch S1 such as a Radio Shack 275-671 and a main slow blow fuse F1 rated at ½ amp and 120 volts AC.

A table of characteristic values for the resistors, capacitors and transistors not specifically identified above is set forth in the following Table I using the component designation as set forth in FIG. 7. The resistors are generally rated at ½ watt with 10% tolerance limits.

TABLE I

| Resistors | Value | Resistors | Value |
| --- | --- | --- | --- |
| R1 | 1K Ohms | R18 | 1K Ohms |
| R2 | 1K | R19 | 4.7K |
| R3 | 1K | R20 | 50K P.C. Pot. |
| R4 | 1K | R21 | 4.7K |
| R5 | 50K P.C. Pot. | R22 | 50K P.C. Pot. |
| R6 | 1K | R23 | 680 Ohms |
| R7 | 1K | R24 | 100 Ohms |
| R8 | 1K | R25 | 1K |
| R9 | 1K | R26 | 1K |
| R10 | 50K P.C. Pot. | R27 | 1K |
| R11 | 1K | R28 | 1K |
| R12 | 680 Ohms | R29 | 6.8K |
| R13 | 1K | R30 | Four-Meg. |
| R14 | 4.7K | R31 | One 120K |
| R15 | 1K | R32 | One Meg. |
| R16 | 4.7K | R33 | 1K |
| R17 | 50K P.C. Pot. | | |

| Capacitors | Value | Transistors | Value |
| --- | --- | --- | --- |
| C1 | .01μF | Q1 | 2N3904 |
| C2 | .01μF | Q2 | 2N3904 |
| C3 | .01μF | Q3 | 2N3904 |
| C4 | .001μF | Q4 | SK3190/184 |
| C5 | 1000μF 35 VDC | Q5 | 2N3904 |
| C6 | .02μF | Q6 | SK3844/123 |
| C7 | .02μF | | |
| C8 | 1000μF 35 VDC | | |
| C9 | Four-40μF 450 VDC | | |

Control and variation over the energy delivered at output 58 for melting and forming a ball at the end of the bonding wire can be accomplished through potentiometers R20 and R22 which control the respective multivibrators of IC 3. R20 and R22 are for example 50K ohm PC potentiometers and control the time on and time off of the respective sections. Thus, both the pulse width or duty cycle and the pulse frequency can be controlled by the potentiometers. Preferably the pulses are adjusted at a duty cycle so that the output capacitance C9 is maintained at or substantially near full charge with recharging during the off periods of the duty cycle.

While the invention has been described with reference to particular example embodiments, it will be appreciated that it is intended to cover the variations and equivalents within the scope of the following claims.

We claim:

1. A method for forming a ball by melting the end of bonding lead wire extending from a capillary wire holding tool for ball bonding of the lead wire to a die pad of an integrated circuit chip or other microelectronic substrate surface comprising;
   substantially enclosing the end of the bonding wire in a shroud or shield;
   flooding the shroud or shield and the end of the bonding wire with an inert gas;
   generating a controlled pulse train of a preset count of electrical pulses for establishing arc discharge between the wire and the shroud or shield thereby controlling and metering the energy delivered for melting and forming a ball of uniform quality at the end of the wire; and maintaining the pulse height and therefore the voltage amplitude of said pulses substantially constant by establishing said voltage across relatively large high voltage capacitance and discharging no more than substantially 10% of the charge stored by said capacitance for generating said pulses.

2. The method of claim 1 wherein said step of generating a controlled pulse train comprises generating pulses of substantially uniform pulse width and duty cycle, pulse height, and pulse frequency.

3. The method of claim 2 comprising the step of varying the quantity of energy delivered by the pulse train for melting and forming a ball, by increasing or decreasing the number of pulses in the pulse train and therefore the duration of the pulse train.

4. The method of claim 2 comprising the step of varying the energy delivered by the pulse train and the rate of energy delivery by increasing or decreasing the pulse width and duty cycle of the pulses.

5. The method of claim 1 or claim 2 comprising the step of adjusting the frequency of the pulses in said pulse train to a level to assure ionization of gas between the end of the bonding wire and said shroud or shield, for continuing arc discharge.

6. The method of claim 1 or claim 2 wherein the frequency of said pulses is at least approximately 1.5 KHz.

7. The method of claim 1 further comprising the step of recharging said capacitance between pulses.

8. The method of claim 1 comprising varying the energy delivered by the pulse train by adjusting the pulse height and therefore voltage amplitude of the pulses to a new level.

9. The method of claim 1 comprising the step of delaying generation of the controlled pulse train until the flooding with inert gas has purged the shroud and end of the bonding wire of air.

10. A method for forming a ball by melting the end of bonding wire extending from a capillary wire holding tool for ball bonding of the wire to a die pad or other microelectronic substrate surface comprising:
substantially enclosing the end of the bonding wire in a shroud;
flooding the shroud and end of the bonding wire with an inert gas;
generating a first pulse train of low voltage electrical pulses;
counting the pulses of the first pulse train;
cutting off said first pulse train after a specified preset number of pulses have been counted;
generating a second high voltage pulse train of said specified preset number of counted pulses in response to the low voltage pulses of the first pulse train; and
delivering said high voltage pulses to a circuit including the bonding wire and shroud for arc discharge between the end of the bonding wire and the shroud, thereby controlling and metering the quantity of energy delivered for melting and forming a ball of uniform quality at the end of the wire.

11. The method of claim 10 comprising electrically isolating the high voltage pulses from the low voltage pulses.

12. The method of claim 10 wherein the step of generating a second pulse train of high voltage pulses comprises controlling a power switch by said low voltage pulses.

13. The method of claim 12 comprising switching high voltage capacitance into and out of said bonding wire and shroud circuit and discharging substantially no more than approximately 10% of the charge stored in such capacitance for generating said high voltage pulses.

14. The method of claim 13 further comprising the step of recharging said capacitance between pulses.

15. The method of claim 10 or claim 12 further comprising the step of varying the energy delivered by the second high voltage pulse train and the rate of energy delivery by increasing or decreasing the pulse width and duty cycle of the low voltage pulses of the first pulse train.

16. The method of claim 10 or claim 12 further comprising the step of varying the quantity of energy delivered by the second pulse train of high voltage pulses by increasing or decreasing the number of low voltage pulses in the first pulse train and therefore the duration of the first pulse train.

17. The method of claim 10 wherein the steps of generating first and second pulse trains comprises generating pulses of substantially uniform pulse width and duty cycle, pulse height, and pulse frequency.

18. Ball bonding apparatus for ball formation by melting the end of bonding wire retained in a capillary tool for ball bonding to a microelectronic substrate comprising:
shroud means movably mounted for positioning substantially around the end of the bonding wire, said shroud means including a tubular portion for delivering inert gas around the end of the bonding wire;
support means coupled to said shroud means for moving said shroud means between a retracted position and an extended position substantially around the end of said bonding wire;
and circuit means for generating and delivering a controlled pulse train of a preset count of electrical pulses for establishing arc discharge between the end of the bonding wire and the shroud means thereby controlling and limiting the energy delivered for melting and ball formation at the end of the bonding wire;
said circuit means comprising pulse oscillator means for generating a first pulse train of low voltage pulses, counter means for counting the pulses of the first pulse train, gate means for cutting off the first pulse train after a specified preset number of pulses have been counted, high voltage source means, and high voltage switching means coupled to said high voltage source means and operatively responsive to the pulses of said first pulse train for generating a corresponding high voltage second pulse train of said specified preset number of counted pulses for arc discharge.

19. The ball bonding apparatus of claim 18 wherein said shroud means comprises a tubular enclosure formed with a notch extending into the tube for receiving the end of the capillary tool and bonding wire.

20. The apparatus of claim 18 wherein said high voltage source means comprises high voltage capacitor means and current limiting means, said capacitor means having sufficient capacitance so that substantially no more than 10% of the charge stored in said capacitor means is discharged during high voltage pulse generation.

21. The apparatus of claim 20 further comprising means for recharging said capacitor means between pulses.

22. Ball bonding apparatus for ball formation at the end of bonding wire retained in a capillary tool comprising:
    shroud means moveably mounted for positioning substantially around the end of the bonding wire, said shroud means including a tubular portion for delivering inert gas around the end of the bonding wire;
    pneumatic piston means coupled to said shroud means for moving said shroud means between a retracted position and an extended position substantially around said bonding wire;
    solenoid means for controlling delivery of air under presssure to said pneumatic piston means;
    timing wheel means formed with at least one timing slot and first sensor means responsive to the first slot for actuating said solenoid means for extending the shroud means;
    second sensor means positioned and arranged for sensing the positioning of the shroud means in the extended position;
    inert gas delivery means responsive to said second sensor means for flooding the end of the bonding wire with inert gas when the shroud means is in the extended position to avoid oxidation during ball formation;
    and circuit means responsive to said second sensor means for generating and delivering a controlled pulse train of a preset count of electrical pulses for arc discharge between the end of the bonding wire and said shroud means, said shroud means also forming an electrode relative to the bonding wire, said circuit means including delay means for delaying delivery of said controlled pulse train until after the shroud has been purged of air by flooding with inert gas, said circuit means thereby controlling and metering the energy delivered for melting and ball formation at the end of the bonding wire.

23. The ball bonding apparatus of claim 22 wherein said shroud means comprises a tubular enclosure formed with a notch extending into the tube for receiving the end of the capillary tool and bonding wire.

24. The ball bonding apparatus of claim 23 wherein said shroud means comprises tungsten element means defining an electrode portion of said shroud means.

25. In a ball bonding apparatus including a capillary tool for supporting bonding wire extending below the tool, circuit means for delivery current and establishing arc discharge between the end of the bonding wire and an electrode for heating and melting the end of the wire to form a ball, and further bonding means for bonding said ball to a microelectronic substrate surface, the improvement comprising:
    said circuit means being constructed and arranged for generating and delivering a controlled pulse train of counted electrical pulses thereby controlling and limiting the energy delivered for melting and ball formation at the end of said wire;
    said circuit means comprising pulse oscillator means for generating pulses at a specified frequency, pulse counter means operatively coupled for counting pulses generated by said pulse oscillator means, count preset means for presetting said pulse counter means for counting a specified preset number of pulses, gate means operatively coupling said pulse counter means and said pulse oscillator means to allow the oscillator means to run during the specified preset number of pulse counts and to shut off the oscillator means at said preset number of pulse counts whereby said pulse oscillator delivers a controlled first train of low voltage pulses, signal means for actuating said pulse oscillator, high voltage source means for delivering a high voltage to the circuit output, and high voltage gate means or switch means interposed between the high voltage source and the circuit output, said gate means or switch means operatively coupled to the pulse oscillator means for delivering a second high voltage pulse train of said preset number of counted pulses at the circuit output in response to a first train of low voltage pulses from said pulse oscillator.

26. The ball bonding apparatus of claim 25 wherein said improvement further comprises tubular shroud means moveably mounted for at least partially enclosing the end of said capillary tool and bonding wire for flooding with inert gas prior to generating and delivering the controlled pulse train.

27. The circuit of claim 25 wherein said high voltage source means comprises a step up transformer, rectifier means at the secondary of said step up transformer, and high voltage capacitor means coupled in parallel across said secondary and rectifier means.

28. The circuit of claim 27 wherein said high voltage gate means or switch means comprises a high voltage transistor.

29. The circuit of claim 25 wherein said high voltage source means comprises high voltage capacitor means coupled in series with said high voltage gate means or switch means.

30. The circuit of claim 29 wherein the pulse oscillator means is constructed and arranged to deliver pulses having a duty cycle with a specified percentage portion of each pulse cycle voltage on and the remainder of each pulse cycle voltage low, said high voltage source of parallel capacitor means operatively coupled for discharging during the voltage on portion of each pulse cycle of the pulse oscillator, means for recharging said capacitor means during the voltage low portion of pulse cycles of the pulse oscillator, and current limiting means at the circuit output, said current limiting means and capacitor means selected so that substantially no more than 10% of the charge stored in said capacitor means is discharged during the voltage on portion of said pulse cycles.

31. The circuit of claim 25 further comprising low voltage source means providing low voltage power supply for portions of said circuit and isolating transformer means for isolating the low voltage portions of the circuit from the high voltage portions.

32. The circuit of claim 31 wherein said low voltage source means comprises step down transformer means and voltage regulator means.

33. The circuit of claim 32 wherein said low voltage source means delivers substantially 5 volts and said high voltage source delivers at least approximately 400-600 volts.

34. The circuit of claim 25 wherein said pulse counter means comprises a first down counter for the tens place and second down counter for the ones place.

35. The circuit of claim 34 wherein said count preset means comprise first and second thumb wheel means coupled to said first and second counter means respectively.

36. The circuit of claim 25 wherein said pulse oscillator means comprises first and second one shot multivibrators coupled back to back.

37. The circuit of claim 36 comprising first and second potentiometers operatively coupled to said first and second multivibrators respectively for controlling the duty cycle of the generated pulses.

* * * * *